(12) United States Patent
Chung et al.

(10) Patent No.: US 10,886,305 B2
(45) Date of Patent: Jan. 5, 2021

(54) DISPLAY DEVICE

(71) Applicant: Samsung Display Co., Ltd., Yongin-si (KR)

(72) Inventors: Yunmo Chung, Yongin-si (KR); Ilhun Seo, Yongin-si (KR); Joosun Yoon, Yongin-si (KR); Daewoo Lee, Yongin-si (KR); Takyoung Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 5 days.

(21) Appl. No.: 16/502,224

(22) Filed: Jul. 3, 2019

(65) Prior Publication Data

US 2020/0091195 A1 Mar. 19, 2020

(30) Foreign Application Priority Data

Sep. 14, 2018 (KR) .......................... 10-2018-0110455

(51) Int. Cl.
| | |
|---|---|
| *H01L 27/12* | (2006.01) |
| *G09G 3/3233* | (2016.01) |
| *H01L 27/32* | (2006.01) |
| *H01L 51/00* | (2006.01) |
| *H01L 29/786* | (2006.01) |

(52) U.S. Cl.
CPC ........ *H01L 27/124* (2013.01); *H01L 27/1218* (2013.01); *H01L 27/1255* (2013.01); *G09G 3/3233* (2013.01); *G09G 2300/0426* (2013.01); *G09G 2320/0257* (2013.01); *H01L 27/3276* (2013.01); *H01L 29/78603* (2013.01); *H01L 29/78657* (2013.01); *H01L 51/0097* (2013.01); *H01L 2251/5338* (2013.01)

(58) Field of Classification Search
CPC ........... H01L 27/1255; H01L 29/78657; H01L 27/1218; H01L 29/78603
USPC ............................................. 257/72
See application file for complete search history.

(56) References Cited

U.S. PATENT DOCUMENTS

| | | | |
|---|---|---|---|
| 7,094,624 B2 * | 8/2006 | Park | H01L 27/3244 257/291 |
| 7,435,633 B2 | 10/2008 | Todorokihara et al. | |
| 7,775,846 B2 * | 8/2010 | Koo | H01L 27/3276 445/24 |
| 8,633,484 B2 | 1/2014 | Lee et al. | |
| 9,548,343 B2 | 1/2017 | Kang | |
| 2004/0135173 A1 * | 7/2004 | Choi | H01L 27/124 257/200 |
| 2006/0102900 A1 * | 5/2006 | Shin | H01L 27/3276 257/59 |

(Continued)

FOREIGN PATENT DOCUMENTS

| | | | |
|---|---|---|---|
| KR | 100635042 B1 | 10/2006 | |
| KR | 100696479 B1 | 3/2007 | |

(Continued)

*Primary Examiner* — David Vu
*Assistant Examiner* — Brandon C Fox
(74) *Attorney, Agent, or Firm* — Cantor Colburn LLP

(57) ABSTRACT

A display device includes: a substrate; a semiconductor layer of a transistor, on the substrate; a gate electrode of the transistor on the semiconductor layer; and a conductive layer element corresponding to the transistor. The conductive layer element is both electrically connected to a constant voltage source and contacts the substrate.

22 Claims, 9 Drawing Sheets

(56) References Cited

U.S. PATENT DOCUMENTS

2019/0305064 A1* 10/2019 Kuniyoshi .......... H01L 27/3276

FOREIGN PATENT DOCUMENTS

| KR | 101244348 B1 | 3/2013 |
| KR | 1020150052645 A | 5/2015 |

* cited by examiner

DISPLAY DEVICE

This application claims priority to Korean Patent Application No. 10-2018-0110455, filed on Sep. 14, 2018, and all the benefits accruing therefrom under 35 U.S.C. § 119, the disclosure of which is incorporated herein in its entirety by reference.

BACKGROUND

1. Field

One or more embodiments relate to a display device.

2. Description of the Related Art

A display device such as an organic light-emitting display device and a liquid crystal display device includes an array substrate including a thin film transistor ("TFT"), a capacitor, and a plurality of wires. The array substrate includes fine patterns such as a TFT, a capacitor, and wires, and the display device is operated by complicated connections between the TFT, capacitor, and wires.

Due to increasing demands for display devices having a compact size and high resolution, there are increasing requirements with respect to a spatial arrangement of fine patterns, a connection structure thereof, a driving method of a TFT, a capacitor and wires included in the display device, and improvement in quality of implemented images.

SUMMARY

One or more embodiments include a display device which may reduce or effectively prevent an after-image phenomenon.

Additional features will be set forth in part in the description which follows and, in part, will be apparent from the description, or may be learned by practice of the presented embodiments.

According to one or more embodiments, a display device may include: an insulating substrate including an organic material; a semiconductor layer of a transistor, on the insulating substrate; a gate electrode of the transistor, on the semiconductor layer; and a conductive layer element corresponding to the transistor, the conductive layer element being both electrically connected to the constant voltage source and contacting the insulating substrate.

The display device may further include a power line in a different layer from that of the conductive layer element and electrically connected to the conductive layer element.

The insulating layer may include an organic layer; and an inorganic layer on the organic layer.

The conductive layer element may contact the insulating substrate at the organic layer.

The insulating substrate may include a first organic layer; a first inorganic layer on the first organic layer; a second organic layer on the first inorganic layer; and a second inorganic layer on the second organic layer.

The insulating substrate may further include an inorganic conductive layer between the first inorganic layer and the second organic layer.

The conductive layer element may contact the insulating substrate at the inorganic conductive layer of the insulating substrate.

The inorganic conductive layer may include conductive hydride amorphous silicon or a conductive oxide.

The display device may further include an insulating layer between the insulating substrate and the conductive layer element, a first contact hole in the insulating layer which exposes the semiconductor layer and a second contact hole in the insulating layer which exposes the insulating substrate. The conductive layer element may contact the semiconductor layer at the first contact hole and contact the insulating substrate at the second contact hole.

The display device may further include an insulating layer between the insulating substrate and the conductive layer element, and a same contact hole in the insulating layer which exposes both the semiconductor layer and the insulating substrate. At the same contact hole, the conductive layer element may contact the semiconductor layer and the insulating substrate.

The display device may further comprise a buffer layer between the insulating substrate and the semiconductor layer and comprising an inorganic layer.

The insulating substrate may comprise an organic layer and an inorganic layer, and the conductive layer element contacts the organic layer.

According to one or more embodiments, a display device may include: an insulating substrate including an organic material; a pixel on the insulating substrate; and a conductive layer element through which a constant voltage is applied to the pixel. At the pixel, the conductive layer element contacts the insulating substrate.

The pixel may be provided in plurality on the insulating substrate, the conductive layer element in contact with the insulating substrate forms a contact portion, and the contact portion may be placed in each of the plurality of pixels.

The pixel may be provided in plurality on the insulating substrate, the conductive layer element in contact with the insulating substrate forms a contact portion, and the contact portion may be placed in less than each of the plurality of pixels.

The pixel may be provided in plurality arranged along a first direction on the insulating substrate, and the conductive layer element may extend along the first direction and overlap a driving transistor in each of the plurality of pixels arranged along the first direction.

The display device may further include a power line through which a power voltage is transmitted to the pixel, the power line extending in a second direction crossing the first direction, in a layer different from that of the conductive layer element and electrically connected to the conductive layer element.

The conductive layer element may include a first power line extending in a first direction and through which a first constant voltage is applied to the pixel and a second power line through which a second constant voltage is applied to the pixel.

The display device may further include a transistor in the pixel, the transistor including a semiconductor layer. A same one of the conductive layer element which contacts the insulating substrate at the pixel may contact the semiconductor layer of the transistor at the pixel.

The insulating substrate may include an organic layer; and an inorganic layer, and the conductive layer element may contact the insulating substrate at the organic layer.

The insulating substrate may further include in order in a direction towards the transistor a first organic layer; a first inorganic layer on the first organic layer; a second organic layer on the first inorganic layer; a second inorganic layer on the second organic layer; and an inorganic conductive layer between the first inorganic layer and the second organic layer. The conductive layer element may contact the insulating substrate at the inorganic conductive layer.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
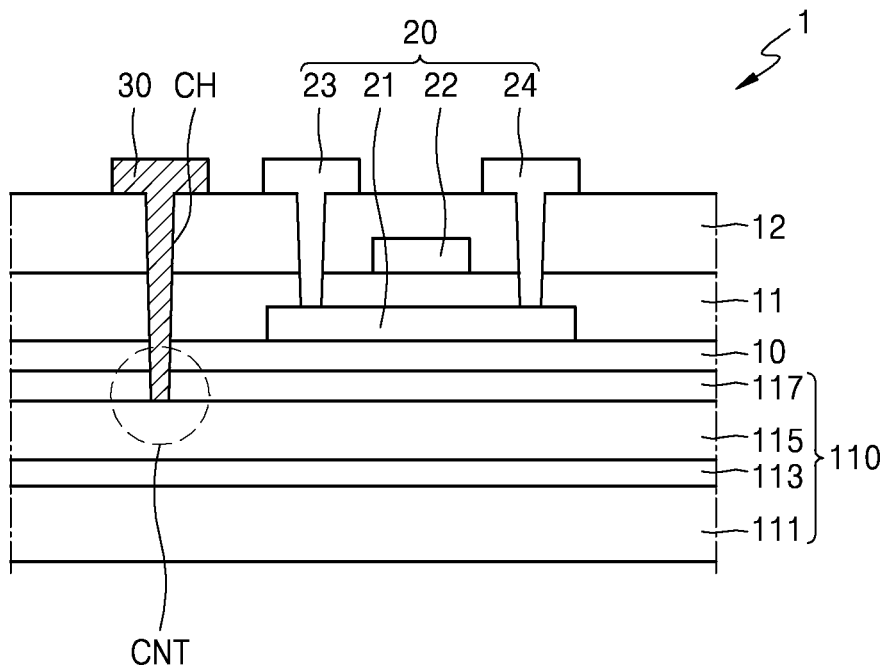
FIGS. 1 through 3 are each an enlarged cross-sectional view schematically illustrating an embodiment of a portion of a display device according to the invention.

As the present disclosure allows for various changes and numerous embodiments, some embodiments will be illustrated in the drawings and described in detail in the written description. Merits and features of the present disclosure and a method of achieving the same may be clearly understood with reference to embodiments which will be described in detail hereinafter in conjunction with the attached drawings. However, the present disclosure is not limited to the embodiments to be disclosed hereinafter and may be implemented in different forms.

Hereinafter, terms such as "first," "second," and the like, are used only to distinguish one component from another, and not to limit the component to the above-mentioned terms.

Hereinafter, an expression used in the singular encompasses the expression of the plural, unless it has a clearly different meaning in the context. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items.

In embodiments to be described hereinafter, it is to be understood that the terms such as "including," "having," and "comprising" are intended to indicate the existence of the features or components disclosed in the specification, and are not intended to preclude the possibility that one or more other features or components thereof may be added.

In following embodiments, when a part such as a layer, a region, or a component is referred to as being related to another element such as being "on" another component, the layer, the region, or the component may be directly on the other layer, the region, or the component, or an intervening layer, region, or component may be present. In contrast, when a part such as a layer, a region, or a component is referred to as being related to another element such as being "directly on" another component, no intervening layer, region, or component is present.

Sizes of components in the drawings may be exaggerated for convenience of explanation. In other words, since sizes and thicknesses of components in the drawings are arbitrarily illustrated for convenience of explanation, the present disclosure is not limited thereto.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described in detail with reference to the attached drawings; throughout the description, same reference numerals will be given to components identical or corresponding to each other, and overlapping description thereof will be omitted.

Figure 2:
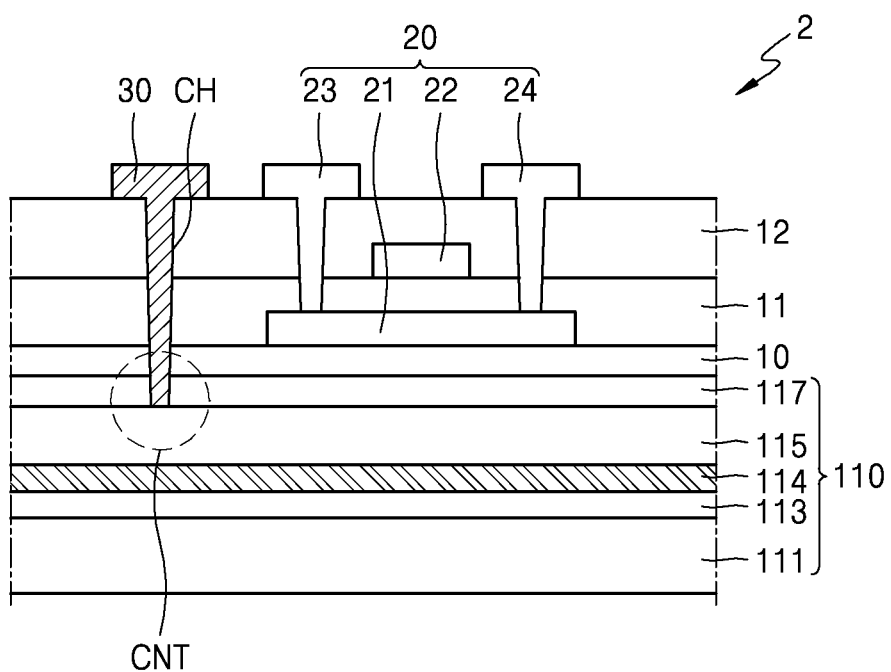
Figure 3:
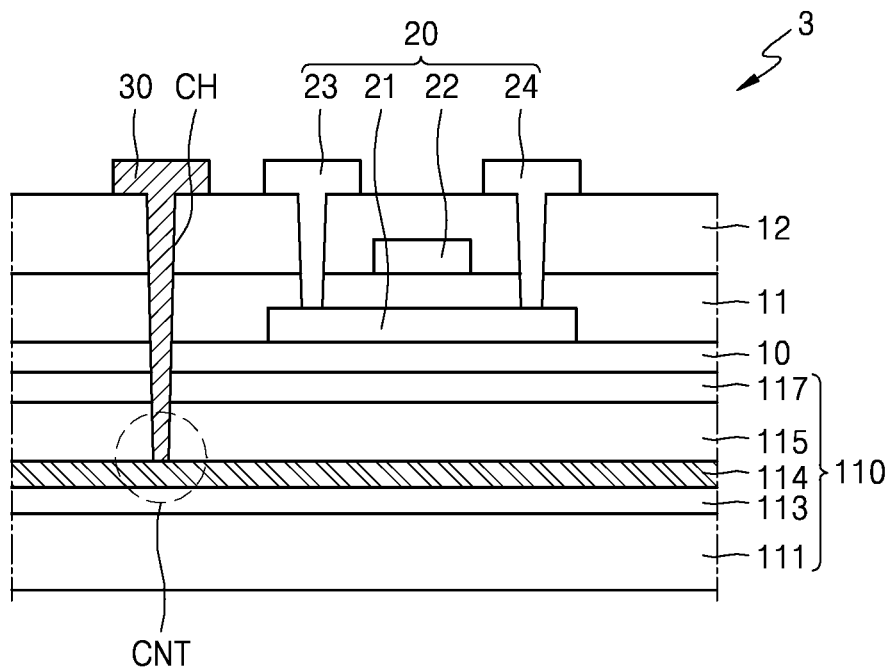

FIGS. 1 through 3 are each an enlarged cross-sectional view schematically illustrating an embodiment of a portion of a display device according to the invention.

Referring to FIG. 1, a display device 1 may include at least one switching element such as a transistor 20 and a conductive layer (member) 30, which are each provided on a substrate 110.

The display device 1 may be one of various display devices, for example, an organic light-emitting display device, a liquid crystal display device, an electrophoretic display device, an electrowetting display device, and the like. Hereinafter, an organic light-emitting display device will be described as an example.

The substrate 110 may include a flexible substrate. The substrate 110 may be a plastic substrate. The substrate 110 may be an insulating substrate including an organic material. The substrate 110 may have a stacked structure including a first layer 111, a second layer 113 on the first layer 111, a third layer 115 on the second layer 113, and a fourth layer 117 on the third layer 115. Compared to a flexible substrate only including organic materials, a flexible substrate having a stacked structure may have relatively lower oxygen permeability, lower water permeability, and higher durability. The substrate 110 may include a substrate including or formed of a transparent material. In other words, the substrate 110 may include a translucent substrate.

The first layer 111 and the third layer 115 have a first thickness and a third thickness, respectively. The first thickness of the first layer 111 may be equal to the third thickness of the third layer 115. The second layer 113 and the fourth layer 117 have a second thickness and a fourth thickness, respectively. The second thickness of the second layer 113 may be equal to the fourth thickness of the fourth layer 117. Each of the first thickness of the first layer 111 and the third thickness of the third layer 115 may be greater than each of the second thickness of the second layer 113 and the fourth thickness of the fourth layer 117. A "thickness" as used herein may indicate a maximum dimension of a layer or element taken along a thickness direction of the display device 1.

The first layer 111 and the third layer 115 may each include an organic layer including an organic material. The first layer 111 and the third layer 115 may each include at least one of polyethersulfone ("PES"), polyacrylate, polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC"), cellulose triacetate ("CTA"), and cellulose acetate propionate ("CAP").

The second layer 113 and the fourth layer 117 may each include an inorganic layer including an inorganic material. The second layer 113 and the fourth layer 117 may include silicon dioxide ($SiO_2$), silicon nitride ($SiN_x$), or the like. Each of the second layer 113 and the fourth layer 117 may be a single-layer or a multi-layer in which $SiO_2$ and $SiN_x$ are alternately stacked. The second layer 113 and the fourth layer 117 may function as barrier layers to interrupt permeation of moisture and/or oxygen into the substrate 110.

A buffer layer 10 may be further provided on the substrate 110. The buffer layer 10 may include at least one of an inorganic layer and an organic layer. In an embodiment, for example, the buffer layer 10 may block permeation of impurities through the substrate 110, may planarize a surface of the substrate 110, and may include a single layer or a multi-layer including or formed of an inorganic material such as $SiO_2$ and/or $SiN_x$. The buffer layer 10 may be disposed or formed on the fourth layer 117, that is, an uppermost layer of the substrate 110. The buffer layer 10 may be omitted.

The transistor 20 may be switching element such as a thin film transistor including a semiconductor layer 21, a gate electrode 22, a source electrode 23, and a drain electrode 24. The transistor 20 may be a driving transistor of a pixel with which the pixel is controlled or driven to generate light and/or display an image.

The semiconductor layer 21 may be placed on the buffer layer 10. The semiconductor layer 21 may include various kinds of materials. In an embodiment, for example, the semiconductor layer 21 may include an inorganic semiconductor material such as amorphous silicon or crystalline silicon. As another example, the semiconductor layer 21 may include an oxide semiconductor or an organic semiconductor material. The semiconductor layer 21 may include a source area and a drain area, respectively at two opposite ends of the semiconductor layer 21, and a channel area which is between the source area and the drain area and corresponding to the gate electrode 22.

The gate electrode 22 may be placed above the semiconductor layer 21. The gate electrode 22 may include one or more of various kinds of conductive materials. In an embodiment, for example, the gate electrode 22 may include a single layer or a multi-layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A first insulating layer 11 may be placed between the semiconductor layer 21 and the gate electrode 22. The first insulating layer 11 may be an inorganic insulating layer. The first insulating layer 11 may include a single layer or a multi-layer including at least one insulating layer material selected from among $SiO_2$, $SiN_x$, silicon oxynitride (SiON), aluminum oxide ($Al_2O_3$), titanium dioxide ($TiO_2$), tantalum pentoxide ($Ta_2O_5$), hafnium dioxide ($HfO_2$), zirconium dioxide ($ZrO_2$), BST, and lead zirconate titanate ("PZT").

The source electrode 23 and the drain electrode 24 respectively contacting two opposite ends of the semiconductor layer 21 may be placed above the gate electrode 22. The source electrode 23 and the drain electrode 24 may include various kinds of conductive materials. In an embodiment, for example, the source electrode 23 and the drain electrode 24 may each include a single layer or a multi-layer including at least one or more material among Al, Pt, Pd, Ag, Mg, Au, Ni, Nd, Ir, Cr, Li, Ca, Mo, Ti, W, and Cu. The source electrode 23 and the drain electrode 24 may contact the semiconductor layer 21 at or via contact holes defined or formed in the first insulating layer 11 and a second insulating layer 12, the contact holes respectively exposing the two opposite ends of the semiconductor layer 21.

A second insulating layer 12 may be placed between the gate electrode 22, and each of the source electrode 23 and the drain electrode 24, respectively. The second insulating layer 12 may be an inorganic insulating layer. The second insulating layer 12 may include a single layer or a multi-layer including at least one insulating layer material selected from among $SiO_2$, $SiN_x$, SiON, $Al_2O_3$, $TiO_2$, $Ta_2O_5$, $HfO_2$, $ZrO_2$, BST, and PZT. In another embodiment, the second insulating layer 12 may be an organic insulating layer.

The conductive layer (element or pattern) 30 may contact the substrate 110 at a contact portion CNT at or via a contact hole CH defined or formed in at least one insulating layer between the conductive layer 30 and the substrate 110. The conductive layer 30 extends into the substrate 110 to form the contact portion CNT. The conductive layer 30 may contact the third layer 115 of the substrate 110. The conductive layer 30 may be placed at a layer other than a layer on which the semiconductor layer 21 is placed. Also, the conductive layer 30 terminates at a layer which is spaced apart from the semiconductor layer 21. In the embodiment shown in FIG. 1, the conductive layer 30 is placed on the second insulating layer 12 to be exposed therefrom. The contact portion CNT may include an interface formed between the conductive layer 30 and the third layer 115 at a distal end of the conductive layer 30, as well as an interface formed with other layers on the substrate 110.

Due to a voltage change when the display device 1 is driven, a mobile electrical charge is induced to an organic layer (for example, the third layer 115) of the substrate 110, and the mobile electrical charge derived to the organic layer may influence properties of the transistor 20 by influencing a back channel of the semiconductor layer 21 in the transistor 20 (more particularly, a driving transistor). Therefore, due to an after-image phenomenon of the display device 1 and the like, image quality may be degraded and errors may occur.

One or more embodiment of the present disclosure includes the conductive layer 30 with which a constant electrical voltage is applied to the substrate 110 to stably maintain a back channel potential of the transistor 20. Accordingly, a voltage of the third layer 115 which contacts the conductive layer 30 may be uniformly maintained. The conductive layer 30 may be electrically connected to a direct current voltage source (not shown) which supplies a direct current voltage which may be otherwise referred to as power supply voltage.

For a display device 2 according to the embodiment described in FIG. 2, in the substrate 110 having the stacked structure illustrated in FIG. 1, the stacked structure including the first layer 111, the second layer 113 on the first layer 111, the third layer 115 on the second layer 113, and the fourth layer 117 on the third layer 115, a fifth layer 114 is additionally placed between the second layer 113 and the third layer 115. Other components are identical to those of the embodiment illustrated in FIG. 1, and thus, detailed descriptions thereof will be omitted.

The fifth layer 114 may be an inorganic layer including an inorganic material. The fifth layer 114 may include a conductive oxide, for example, hydride amorphous silicon (a-Si: H) or IGZO: Hx that is doped with an N-type impurity or a P-type impurity and having conductivity.

In an embodiment of the present disclosure, when a voltage in the third layer 115 due to electrical charge transfer in the third layer 115 is insufficiently uniform, the voltage in the third layer 115 may be maintained uniform by adding the fifth layer 114 that has conductivity.

A display device 3 according to an embodiment described with reference to FIG. 3 is different from the display device 2 shown in FIG. 2 in that the conductive layer 30 contacts the fifth layer 114 in the stacked structure of the substrate 110 shown in FIG. 2. Other components are identical to those of the embodiment illustrated in FIGS. 1 and 2, and thus, detailed descriptions thereof will be omitted.

In an embodiment of the present disclosure, when the voltage in the third layer 115 due to the electrical charge transfer in the third layer 115 is insufficiently uniform, the voltage in the third layer 115 may be maintained uniform by adding the fifth layer 114 that has conductivity and forming, in the fifth layer 114, the contact portion CNT of the conductive layer 30 and the substrate 110. The contact portion CNT may include an interface formed between the conductive layer 30 and the fifth layer 114 at a distal end of the conductive layer 30.

Figure 4:
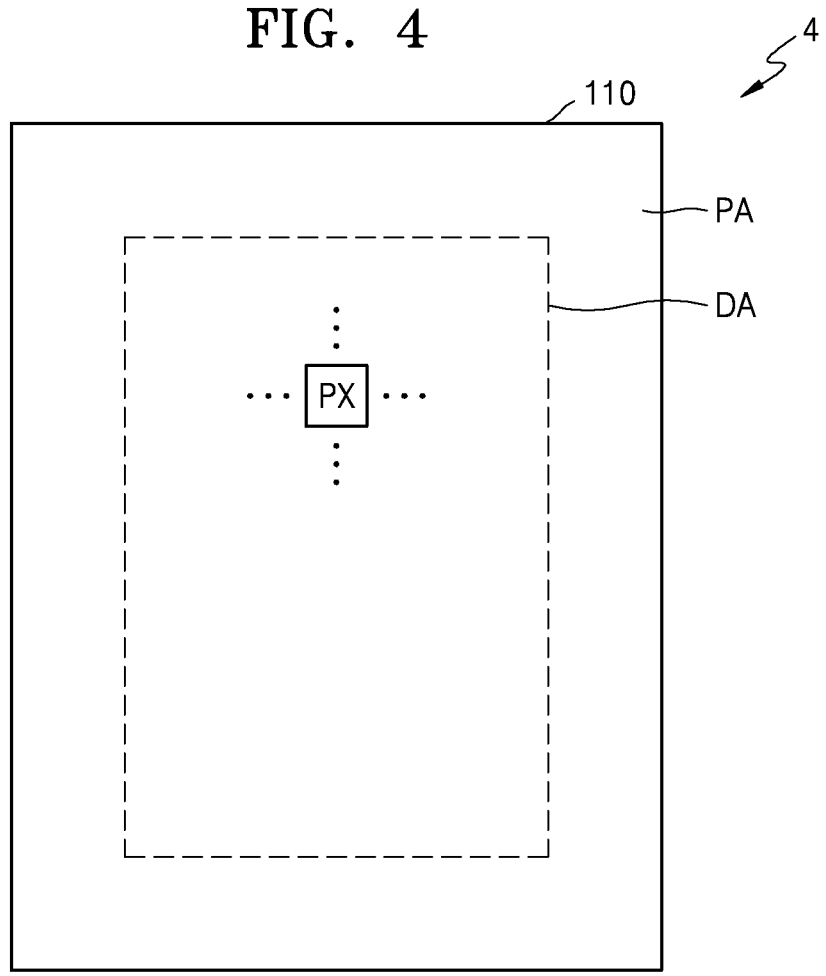
FIG. 4 is a top-plan view schematically illustrating another embodiment of a display device according to the invention.

FIG. 4 is a top-plan view schematically illustrating another embodiment of a display device 4 according to the invention.

Referring to FIG. 4, the display device 4 according to an embodiment includes the substrate 110. The substrate 110 includes a display area DA and a peripheral area PA which is outside the display area DA. An image may be generated and/or displayed at the display area DA, while the image may not be generated and/or displayed at the peripheral area PA.

A pixel PX provided in plurality may be arranged in the display area DA of the substrate 110. Various conductive wires (interconnects) delivering electric signals to be applied to the display area DA via the pixels PX may be placed in the peripheral area PA of the substrate 110. The various conductive wires (interconnects) may be connected to the pixels PX to apply the electrical signals thereto for generating and/or displaying an image at the display area DA.

The pixels PX may include a first pixel to emit a first color, a second pixel to emit a second color, and a third pixel to emit a third color. The first pixel may be a red pixel, a second pixel may be a green pixel, and the third pixel may be a blue pixel. However, embodiments of the present disclosure are not limited thereto and the pixels may include one or more pixels emitting different colors.

Figure 5:
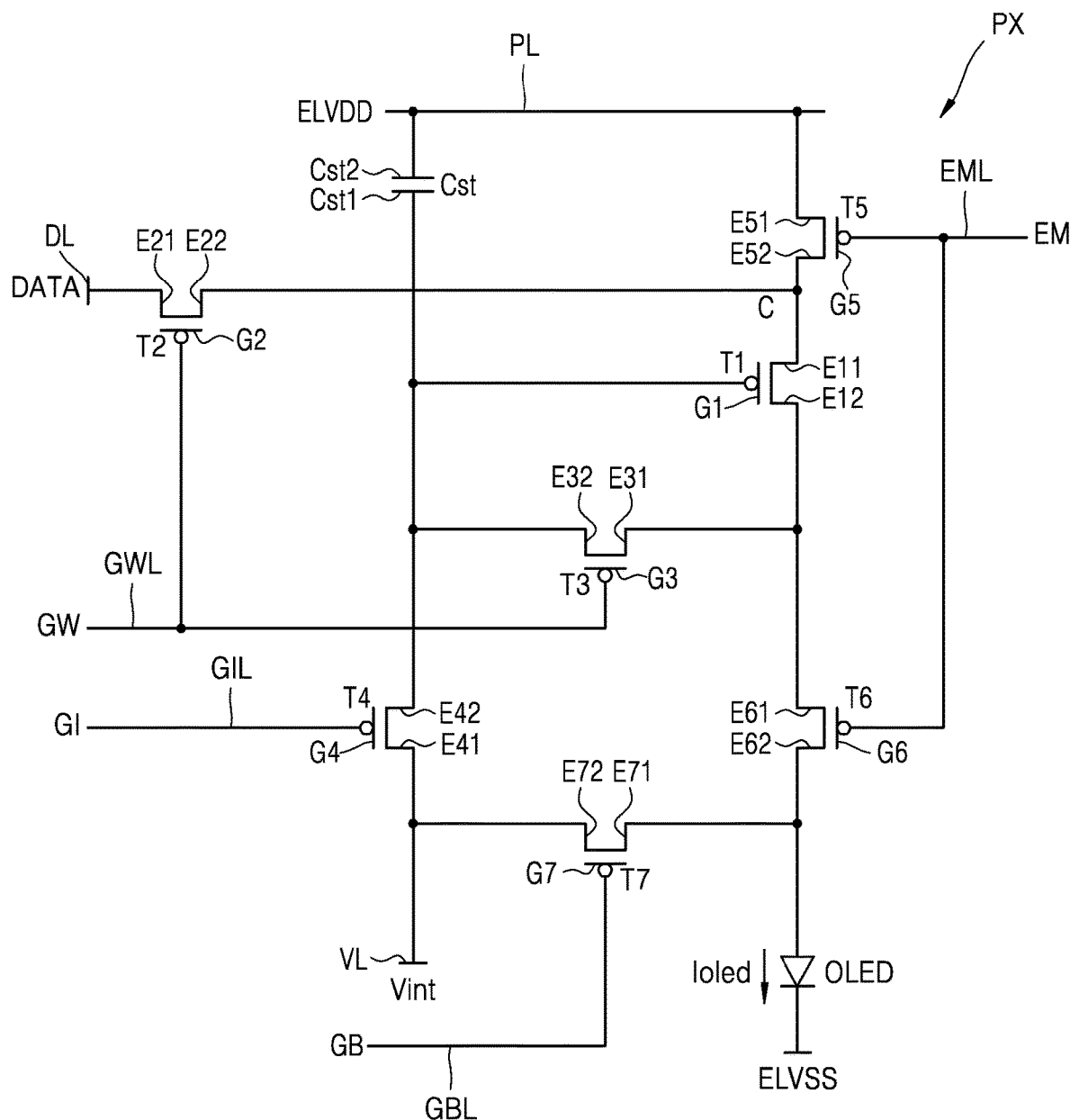
FIG. 5 is an equivalent circuit diagram of an embodiment of a pixel in the display device shown in FIG. 4, according to the invention.

FIG. 5 is an equivalent circuit diagram of an embodiment of a pixel in the display device shown in FIG. 4.

A pixel PX includes a light-emitting device to emit light and a pixel circuit which receives a signal from the plurality of wires and drives the light-emitting device to emit the light. An image may be displayed with the emitted light. Hereinafter, a pixel PX having an organic light-emitting device OLED as a light-emitting device will be described as an example.

The plurality of wires may include a first scanning line GIL through or with which a first scanning signal GI is transmitted, a second scanning line GWL through or with which a second scanning signal GW is transmitted, a third scanning signal GBL through or with which a third scanning signal GB is transmitted, a data line DL to through or with which a data signal DATA is transmitted, and a power line PL through or with which a first power supply voltage ELVDD is transmitted. The first power supply voltage may be a direct current voltage as used herein. However, the present disclosure is not limited thereto, and the plurality of wires may, as shown in FIG. 5, further include an initialization line VL through or which an initialization voltage Vint is transmitted and an emission control line EML through or with which an emission control signal EM is transmitted.

A pixel circuit in the pixel PX may include a plurality of transistors T1 through T7 and capacitors Cst. In FIG. 5, respective pairs of first electrodes E11, E21, E31, E41, E51, E61 and E71 and second electrodes E12, E22, E32, E42, E52, E62 and E72 may be source electrodes (source areas) or drain electrodes (drain areas) within a transistor among the plurality of transistors T1 through T7, according to types of the transistors (p-type or n-type) and/or operational conditions thereof.

The first electrodes E11, E21, E31, E41, E51, E61 and E71 and the second electrodes E12, E22, E32, E42, E52, E62 and E72 as being source/drain electrodes may be in a same layer as each other, as illustrated in FIGS. 1 through 3. Similarly, the first electrodes E11, E21, E31, E41, E51, E61 and E71 and the second electrodes E12, E22, E32, E42, E52, E62 and E72 as being source/drain regions may be in a same layer as each other and as the channel areas, as illustrated for the semiconductor layer 21 in FIGS. 1 through 3. In embodiments, the source/drain electrodes within a transistor are in a different layer than the source/drain/channel regions, as illustrated in FIGS. 1 through 3. That is, as being respectively "in a same layer," elements may be portions of a same material layer, such as being formed from a same material layer.

A first transistor T1 includes a gate electrode G1 connected to a first electrode Cst1 of the capacitor Cst, the first electrode E11 connected to a power line PL via a fifth transistor T5, and the second electrode E12 electrically connected to a pixel electrode of the organic light-emitting device OLED via a sixth transistor T6. The first transistor T1, which functions as a driving transistor, receives a data signal DATA according to a switching operation of the second transistor T2 and supplies an electrical current Ioled to the organic light-emitting device OLED.

The second transistor T2 includes a gate electrode G2 connected to the second scanning line GWL, the first electrode E21 connected to the data line DL, and the second electrode E22 connected to the first electrode E11 of the first transistor T1. The second transistor T2 is turned on in response to the second scanning signal GW received through the second scanning line GWL and performs a switching operation to deliver the data signal DATA, from the data line DL, to the first electrode E11 of the first transistor T1.

A third transistor T3 includes a gate electrode G3 connected to the second scanning line GWL, the first electrode E31 connected to the second electrode E12 of the first transistor T1, and the second electrode E32 connected to the first electrode Cst1 of the capacitor Cst, the second electrode E42 of the fourth transistor T4 and the gate electrode G1 of the first transistor T1. The third transistor T3 is turned on in response to the second scanning signal GW delivered via the second scanning line GWL and diode-connects the first transistor T1.

The fourth transistor T4 includes a gate electrode G4 connected to the first scanning line GIL, the first electrode E41 connected to the initialization line VL, and the second electrode E42 connected to the first electrode Cst1 of the capacitor Cst, the second electrode E32 of the third transistor T3 and the gate electrode G1 of the first transistor T1. The fourth transistor T4 is turned on in response to the first scanning signal GI delivered via the first scanning line GIL and performs an initialization operation to deliver the initialization voltage Vint to the gate electrode G1 of the first transistor T1 and initialize a gate voltage of the first transistor T1.

The fifth transistor T5 includes a gate electrode G5 connected to the emission control line EML, the first electrode E51 connected to the power line PL, and the second electrode E52 connected to the first electrode E11 of the first transistor T1 and the second electrode E22 of the second transistor T2.

The sixth transistor T6 includes a gate electrode G6 connected to the emission control line EML, the first electrode E61 connected to the second electrode E12 of the first transistor T1 and the first electrode E31 of the third transistor T3, and the second electrode E62 connected to the pixel electrode in the organic light-emitting device OLED.

As the fifth transistor T5 and the sixth transistor T6 are simultaneously turned on in response to the emission control signal EM delivered via the emission control line EML, an electrical current flows through the organic light-emitting device OLED.

The seventh transistor T7 includes a gate electrode G7 connected to the third scanning line GBL, the first electrode E71 connected to the second electrode E62 of the sixth transistor T6 and the pixel electrode of the organic light-emitting device OLED, and a second electrode E72 connected to the initialization line VL. The seventh transistor T7 is turned on in response to the third scanning signal GB delivered via the third scanning line GBL and performs an initialization operation to deliver the initialization voltage Vint to the pixel electrode of the organic light-emitting device OLED and initialize a voltage of the pixel electrode of the organic light-emitting device.

The third scanning line GBL connected to the gate electrode G7 of the seventh transistor T7 may be the first scanning line GIL or the second scanning line GWL in a next row or a previous row, respectively, and the third scanning signal GB may be the first scanning signal GI or the second scanning signal GW of the next row or the previous row, respectively. In an embodiment, the seventh transistor T7 may be omitted.

The capacitor Cst includes the first electrode Cst1 connected to the gate electrode G1 of the first transistor T1 and the second electrode Cst2 connected to the power line PL. The first electrode Cst1 of the capacitor Cst is also connected to the second electrode E32 of the third transistor T3 and the second electrode E42 of the fourth transistor T4.

The organic light-emitting device OLED includes the pixel electrode and a common electrode which opposes the pixel electrode. A second power supply voltage ELVSS may be applied to the common electrode. The second power supply voltage may be a direct current voltage as used herein.

An intermediate layer is provided between the pixel electrode and the common electrode within the organic light-emitting device OLED. The intermediate layer includes an organic emission layer and may further include at least one of a hole injection layer ("HIL"), a hole transport layer ("HTL"), an electron transport layer ("ETL"), and an electron injection layer ("EIL"). However, the embodiment is not limited thereto and various functional layers may be further placed between the pixel electrode and the common electrode, within the organic light-emitting device OLED.

The organic emission layer may emit red light, green light, or blue light. However, the present disclosure is not limited thereto and the organic emission layer may emit white light. In this case, the organic emission layer may have a structure in which a luminescent material that emits red light, a luminescent material that emits blue light, and a luminescent material that emits green light are stacked, or a structure in which the luminescent material that emits red light, the luminescent material that emits green light, and the luminescent material that emits blue light are combined together.

Under control of the pixel circuit, the organic light-emitting device OLED may display an image by receiving a driving current Ioled from the first transistor T1 and emit light of a color.

Figure 6:
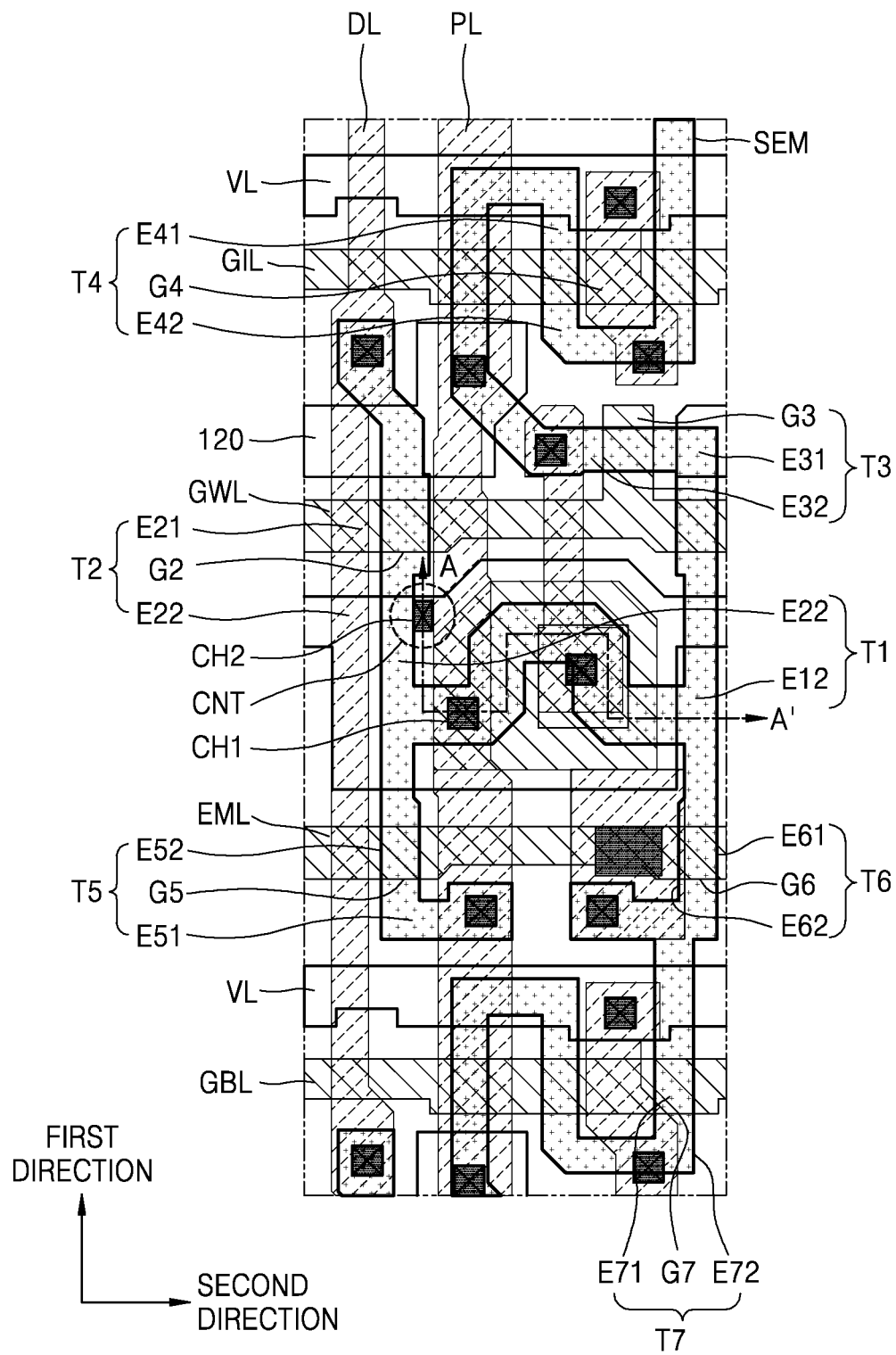
FIG. 6 is a top-plan view of an embodiment of a pixel circuit of the pixel shown in FIG. 5, according to the invention.
Figure 7:
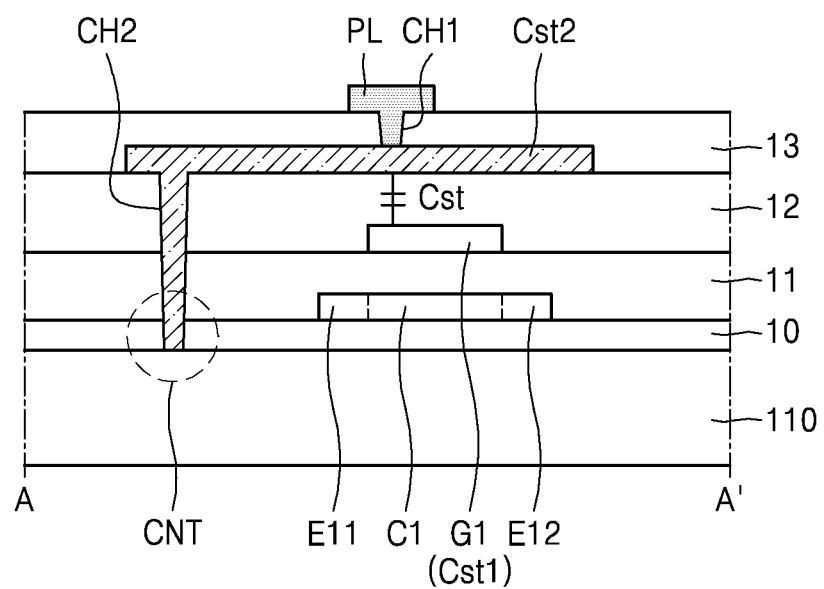
FIG. 7 is a cross-sectional view taken along line A-A' shown in FIG. 6.

FIG. 6 is a top-plan view of an embodiment of the pixel circuit of the pixel shown in FIG. 5, according to an embodiment of the present disclosure. FIG. 7 is a cross-sectional view taken along line A-A' shown in FIG. 6.

In an embodiment, the pixels PX are arranged at points at which a wire among the plurality of wires lengthwise extending in a first direction (column direction) and a wire among the plurality of wires lengthwise extending in a second direction (row direction) which is a direction crossing the first direction (column direction), intersect each other. The first scanning line GIL, the second scanning line GWL, the third scanning line GBL, the initialization line VL, and the emission control line EML each lengthwise extend in the second direction. The data line DL and the power line PL each lengthwise extend in the first direction.

As used herein, a display device and components thereof according to one or more embodiment of the invention, may be disposed in a plane defined by the first and second directions. In FIG. 7 for example, the horizontal direction may represent the first direction and/or the second direction. A thickness of the display device and components thereof according to one or more embodiment of the invention may extend in a third direction crossing each of the first and second directions. In FIGS. 1 through 3 and FIG. 7, for example, the vertical direction represents the third (thickness) direction.

Each of the first transistor T1 through the seventh transistor T7 in the pixel circuit includes a semiconductor layer including a source area, a drain area, and a channel area which is between the source area and the drain area, and a gate electrode arranged in an area corresponding to the channel area and insulated from the semiconductor layer. The source area may correspond to one of the first electrode and the second electrode shown in FIG. 5, and the drain area may correspond to the other one of the first electrode and the second electrode. Hereinafter, for convenience of explanation, the source area and the drain area will be referred to as the first electrode and the second electrode.

The substrate 110 may be a flexible substrate. The substrate 110 may be a plastic substrate. The substrate 110 may have a stacked structure including at least one organic layer and at least one inorganic layer. In an embodiment, for example, as shown in FIG. 1, the substrate 110 may have a stacked structure including the first layer 111/the second layer 113/the third layer 115/the fourth layer 117, that is, a stacked structure including an organic layer/an inorganic layer/an organic layer/an inorganic layer. The inorganic layer, which is an uppermost layer of the substrate 110, may function as a barrier layer.

In other embodiments, as shown in FIGS. 2 and 3, the substrate 110 may have a stacked structure including the first layer 111/the second layer 113/the fifth layer 114/the third layer 115/the fourth layer 117, that is, a stacked structure including an organic layer/an inorganic layer/a conductive inorganic layer/an organic layer/an inorganic layer.

A semiconductor layer SEM may be placed above the substrate 110. The semiconductor layer SEM may include various materials. In an embodiment, for example, the semiconductor layer SEM may include an inorganic semiconductor material such as amorphous silicon or crystalline silicon. As another example, the semiconductor layer SEM may include an oxide semiconductor or an organic semiconductor material. The semiconductor layer SEM may include a source area and a drain area, respectively at two opposite ends of the semiconductor layer SEM, and a channel area which is between the source area and the drain area. The source area and the drain area may be doped with an N-type impurity or a P-type impurity. Portions of the semiconductor layer SEM within the first transistors T1 through the seventh transistor T7 are arranged in a same layer, connected to one another, and may be curved in various shapes in the top plan view. That is, the semiconductor layers SEM of the first transistors T1 through the seventh transistor T7 may be formed from a same material layer to be disposed in a same layer among those layers on the substrate 110. The portions of the collective semiconductor layer SEM may be connected to each other to form a single, unitary semiconductor layer SEM and may be common to each of the transistors.

The buffer layer 10 may be placed between the substrate 110 and the semiconductor layer SEM. In an embodiment, the buffer layer 10 may be omitted.

The first insulating layer 11 (see FIG. 7) is placed between the semiconductor layer SEM and the gate electrodes G1 through G7.

The first scanning line GIL, the second scanning line GWL, the third scanning line GBL, and the emission control line EML that each lengthwise extend in the second direction are arranged in a same layer as that of the gate electrodes G1 through G7 of the first transistor T1 through the seventh transistor T7. That is, the first scanning line GIL, the second scanning line GWL, the third scanning line GBL, the emission control line EML and the gate electrodes G1 through G7 may be formed from a same material layer to disposed in a same layer among those layers on the substrate 110.

The second insulating layer 12 (see FIG. 7) is placed on the gate electrodes G1 through G7 of the first transistor T1 through the seventh transistor T7.

The first transistor T1 includes a semiconductor layer in which the first electrode E11, the second electrode E12 and the channel area C1 are included, and the gate electrode G1. The gate electrode G1 of the first transistor T1, as seen from above (e.g., along a thickness direction), overlaps the channel area C1. The semiconductor layer in the first transistor T1 may form the channel area C1 having a relatively large overall length by having a curve between the first electrode E11 and the second electrode E12. Accordingly, a path or driving range of a gate voltage applied to the gate electrode G1 may be increased. In various embodiments, for example, a curved shape or a bent shape like '⊏,' '⊏,' '⊐,,' 'S,' 'M,' and 'W' are available for a planar shape of the semiconductor layer of the first transistor T1.

The second transistor T2 includes a semiconductor layer, in which the first electrode E21, the second electrode E22 and the channel area C2 are included, and the gate electrode G2. The gate electrode G2 of the second transistor T2, as seen from above, overlaps the channel area C2 such that a position of the channel area C2 may correspond to G2. The first electrode E21 of the second transistor T2 is electrically connected to the data line DL at or via contact holes in the first insulating layer 11 through a third insulating layer 13 (see FIG. 7). The second electrode E22 of the second transistor T2 is connected to the first electrode E11 of the first transistor T1.

The third transistor T3 includes a semiconductor layer, in which the first electrode E31, the second electrode E32 and the channel area C3 are included, and the gate electrode G3. The gate electrode G3 of the third transistor T3, as seen from above, overlaps the channel area C3 (such that a position of the channel area C3 may correspond to G3) and is formed by a portion of the second scanning line GWL. The first electrode E31 of the third transistor T3 is connected to the second electrode E12 of the first transistor T1, and the second electrode E32 is electrically connected such as by a connection electrode (not shown), to the gate electrode G1 of the first transistor T1. The connection electrode connects the second electrode E32 of the third transistor T3 to the gate electrode G1 of the first transistor T1 which are in different layers from each other, at or via a first contact hole in the first insulating layer 11 through the third insulating layer 13 exposing the second electrode E32 of the third transistor T3 and a second contact hole in the second insulating layer 12 and the third insulating layer 13 exposing the gate electrode G1 of the first transistor T1. Such first and second contact holes may be spaced apart from each other along the first and/or second directions.

The fourth transistor T4 includes a semiconductor layer in which the first electrode E41, the second electrode E42 and the channel area C4 are included, and the gate electrode G4. The gate electrode G4 of the fourth transistor T4, as seen from above, overlaps the channel area C4 (such that a position of the channel area C4 may correspond to G4), and is formed by a portion of the first scanning line GIL. The first electrode E41 of the fourth transistor T4 is electrically connected to the initialization line VL at or via a connection electrode (not shown), and the second electrode E42 is electrically connected to the second electrode E32 of the third transistor T3 and the gate electrode G1 of the first transistor T1. The connection electrode connects the first electrode E41 of the fourth transistor T4 to the initialization line VL which are in different layers from each other, at or through a first contact hole in the first insulating layer 11 through the third insulating layer 13 exposing the first electrode E41 of the fourth transistor T4 and a second contact hole in the third insulating layer 13 exposing the initialization line VL. Such first and second contact holes may be spaced apart from each other along the first and/or second directions. The initialization line VL is placed in the same layer as the layer in which the second electrode Cst2 of the capacitor Cst is placed.

The fifth transistor T5 includes a semiconductor layer in which the first electrode E51, the second electrode E52 and a channel area C5 are included, and a gate electrode G5. The gate electrode G5 of the fifth transistor T5, as seen from above, overlaps the channel area C5 (such that a position of the channel area C5 may correspond to G5), and is formed by a portion of the emission control line EML. The first electrode E51 of the fifth transistor T5 is electrically connected to the power line PL at or via the contact hole in the first insulating layer 11 through the third insulating layer 13 partially exposing the first electrode E51, and the second electrode E52 of the fifth transistor T5 is connected to the first electrode E11 of the first transistor T1.

The sixth transistor T6 includes a semiconductor layer in which the first electrode E61, the second electrode E62 and a channel area C6 is included, and a gate electrode G6. The gate electrode G6 of the sixth transistor T6, as seen from above, overlaps the channel area C6 (such that a position of the channel area C6 may correspond to G6) and is formed by a portion of the emission control line EML. The first electrode E61 of the sixth transistor T6 is connected to the second electrode E12 of the first transistor T1, and the second electrode E62 of the sixth transistor T6 is electrically connected to the pixel electrode of the organic light-emitting device OLED. The second electrode E62 of the sixth transistor T6 is electrically connected to a connection electrode (not shown) on the third insulating layer 13 at or via the contact hole in the first insulating layer 11 through the third insulating layer 13 partially exposing the second electrode E62. The pixel electrode is connected to the second electrode E62 of the sixth transistor T6 by being electrically connected to the connection electrode through or at a via hole in a fourth insulating layer (not shown) on the connection electrode connected to the second electrode E62 of the sixth transistor T6. In an embodiment, the fourth insulating layer may be disposed on the third insulating layer 13, and the pixel electrode may be disposed on the fourth insulating layer such that the via hole described above exposes the connection electrode 301 for connection thereof to the pixel electrode.

The seventh transistor T7 includes a semiconductor layer in which the first electrode E71, the second electrode E72 and the channel area C7 are included, and a gate electrode G7. The gate electrode G7 of the seventh transistor T7, as seen from above, overlaps the channel area C7 (such that a position of the channel area C7 may correspond to G7), and is formed by a portion of the third scanning line GBL. The second electrode E72 of the seventh transistor T7 is connected to the first electrode E41 of the fourth transistor T4, and the first electrode E71 is connected to the second electrode E62 of the second transistor T2.

Referring to FIG. 7, the first electrode Cst1 of the capacitor Cst is the gate electrode G1 of the first transistor T1. In other words, it may be understood that the first electrode Cst1 of the capacitor Cst and the gate electrode G1 of the first transistor T1 are integrally formed. The first electrode Cst1 of the capacitor Cst, which is isolated from neighboring pixels and formed in a discrete (island) planar shape, is disposed in a same layer and is a portion of a same material layer as those of the first scanning line GIL, the second scanning line GWL, the third scanning line GBL, and the emission control line EML.

The second electrode Cst2 of the capacitor Cst is connected to neighboring pixels in the second direction, that is, at second electrodes Cst2 of the pixels in a same (or single) row extended along the second direction. The second electrode Cst2 of the capacitor Cst overlaps the first electrode Cst1 to cover all the first electrode Cst1 (e.g., extend further than edges of the first electrode Cst1). As seen in a plan view and cross-sectional view, the second electrode Cst2 overlaps the first transistor T1 as including the gate electrode G1 and the layer defined by E11, C1 and E12. The second insulating layer 12 between the first electrode Cst1 and the second electrode Cst2 of the capacitor Cst functions as a dielectric layer. The second electrode Cst2 of the capacitor Cst has or defines an opening at a position corresponding to the contact hole that exposes a portion of the first electrode Cst1 of the capacitor Cst.

The third insulating layer 13 is placed on the second electrode Cst2 of the capacitor Cst. The data line DL and the power line PL, which each lengthwise extend in the first direction, are arranged on the third insulating layer 13. The power line PL partially overlaps the second electrode Cst2 of the capacitor Cst.

In an embodiment, a collective conductive layer element may include a first power line extending in the first direction and through which a first direct current voltage is applied to a pixel PX, and a second power line extending in the second direction crossing the first direction and through which a second direct current voltage is applied to a same pixel PX to which the first direct current voltage is applied. Referring to FIGS. 6 and 7, for example, the second electrode Cst2 of the capacitor Cst is electrically connected to the power line PL at or via a contact hole CH1 in the third insulating layer 13 that partially exposes the second electrode Cst2 of the capacitor Cst. Accordingly, the power line PL lengthwise extended in the first direction may function as a first power line lengthwise extended in the first direction, the second electrode Cst2 of the capacitor Cst lengthwise extended in the second direction may function as a second power line lengthwise extended in the second direction, and the collective power line member (PL+Cst) may have a mesh structure overall in the top plan view. In addition, the power line PL is electrically connected to the first electrode E51 of the fifth transistor T5.

The initialization line VL lengthwise extending in the second direction is placed in the same layer as the layer in which the second electrode Cst2 of the capacitor Cst is placed. The data line DL and the power line PL, which each lengthwise extend in the first direction, are arranged on the third insulating layer 13 (see FIG. 7).

A light-shielding member 120 may be placed in the pixel PX. The light-shielding member 120 may cover a portion of at least one of the first electrode E21 and the second electrode E22 in the second transistor T2, a portion of at least one of the first electrode E31 and the second electrode E32 in the third transistor T3, and/or a portion of at least one of the first electrode E41 and the second electrode E42 in the fourth transistor T4.

The light-shielding member 120 may be placed in a layer that is the same as the layer in which the initialization line VL is placed. The light-shielding member 120 may include a material that is the same as the material included in the initialization line VL, such as being a portion of a same material layer as the initialization line VL. The light-shielding member 120 may be electrically connected to the power line PL or the initialization line VL. The light-shielding member 120, which is connected to the power line PL or the initialization line VL and receives a positive voltage, may reduce or effectively prevent the second transistor T2, the third transistor T3, and the fourth transistor T4 from being influenced by other electric signals from a peripheral area around such transistors. In other words, the light-shielding member 120 may improve operational performances of the pixel circuit in the pixel PX.

Referring to FIG. 7, the first transistor T1 of the pixel PX includes the semiconductor layer in which the first electrode E11, the second electrode E12, and the channel area C1 are defined or included, and the gate electrode G1 placed to correspond to the channel area C1. The capacitor Cst which overlaps the first transistor T1, as seen in a plan view and cross-sectional view, is provided. The capacitor Cst includes the first electrode Cst1 as a lower electrode and the second electrode Cst2 as an upper electrode.

The second electrode Cst2 of the capacitor Cst is electrically connected to the power line PL at or via the contact hole CH1 in the third insulating layer 13 and contacts the substrate 110 at the contact portion CNT at or via a contact hole CH2 extended through the buffer layer 10 and each of the first insulating layer 11 through the third insulating layer 13. Referring to FIGS. 1 through 3, the second electrode Cst2 of the capacitor Cst contacts the third layer 115 (see FIG. 1 or 2) or the fifth layer 114 (see FIG. 3) of the substrate 110. In other words, the second electrode Cst2 of the capacitor Cst corresponds to the conductive layer 30 shown in FIGS. 1 through 3. The contact portion CNT may be placed near the first transistor T1 as including the gate electrode G1 and the layer defined by E11, C1 and E12. The second electrode Cst2 of the capacitor Cst may provide a constant first power supply voltage ELVDD (see FIG. 5) to the substrate 110, thereby maintaining a voltage in the third layer 115 of the substrate 110 uniform.

Figure 8:
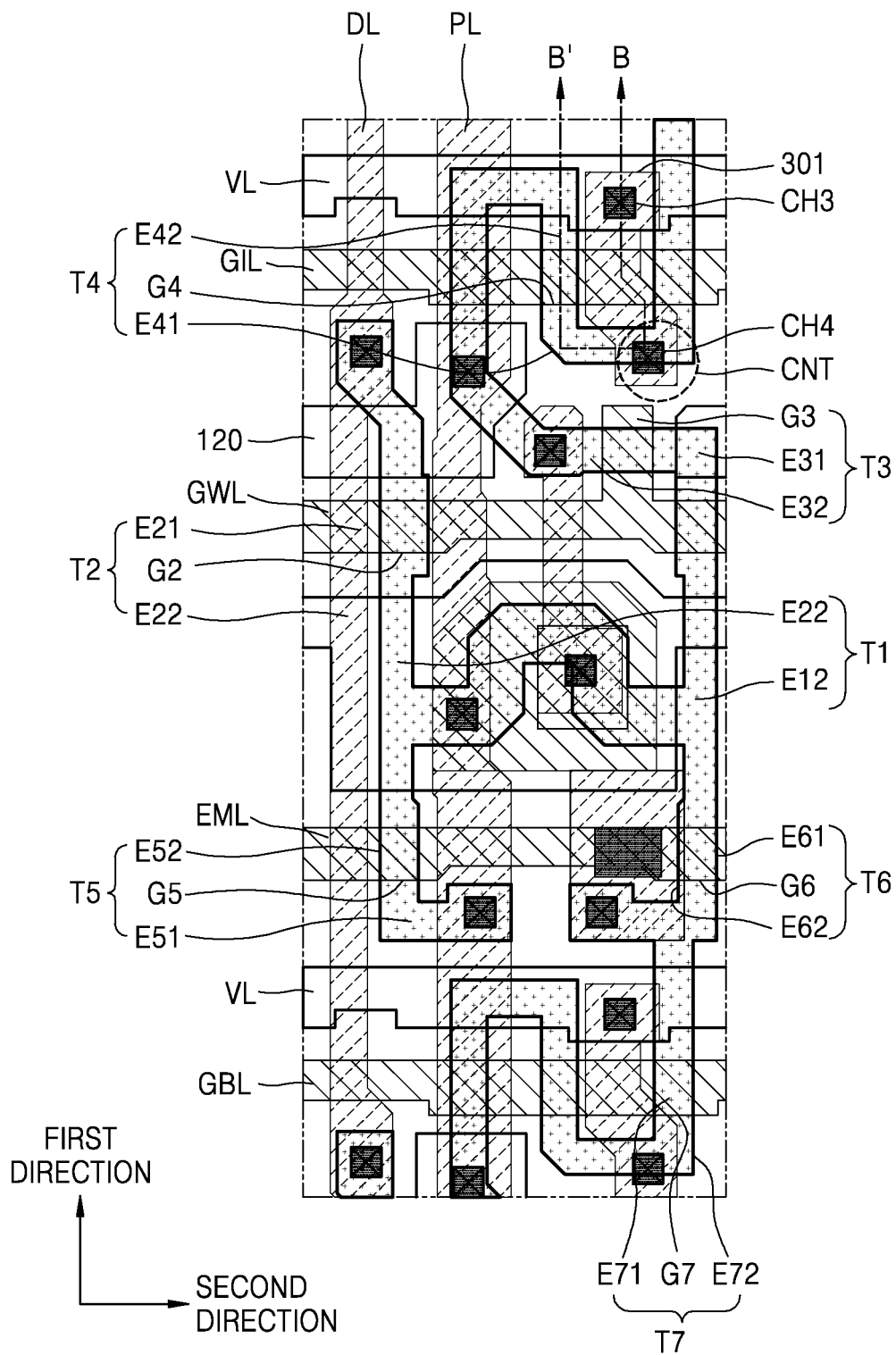
FIG. 8 is a top-plan view of another embodiment of a pixel circuit of the pixel shown in FIG. 5, according to the invention.
Figure 9:
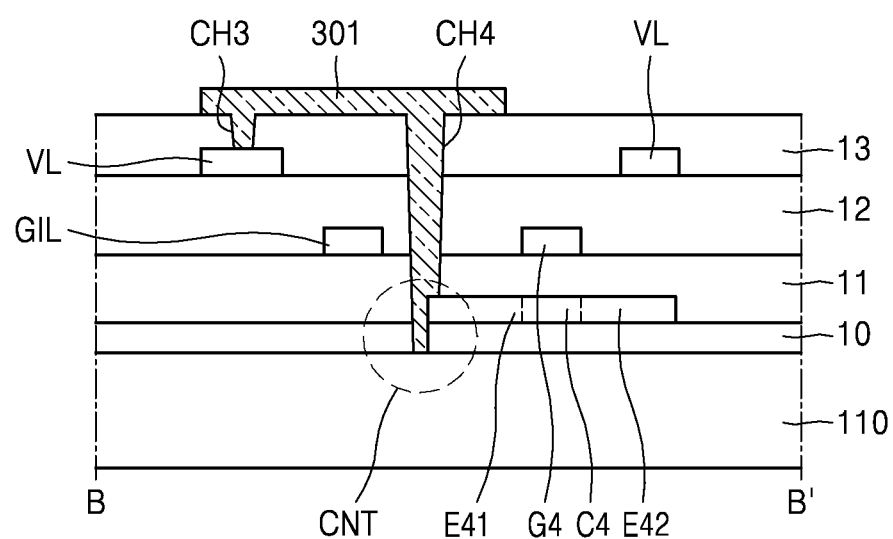
FIG. 9 is a cross-sectional view taken along line B-B' shown in FIG. 8.

FIG. 8 is a top-plan view of another embodiment of a pixel circuit of the pixel shown in FIG. 5, according to the invention. FIG. 9 is a cross-sectional view taken along line B-B' shown in FIG. 8.

The embodiment described in FIG. 8 is different from the embodiment described in FIG. 6 in that the connection electrode 301 corresponds to the conductive layer 30 shown in FIGS. 1 through 3. Hereinafter, configurations different from those of FIGS. 6 and 7 will be mainly described. At the transistor, the connection electrode 301 connects elements which are in different layers from each other, to each other, by extending through one or more insulating layers.

Referring to FIGS. 8 and 9, the connection electrode 301 is electrically connected to the initialization line VL at or via a contact hole CH3 in the third insulating layer 13 and contacts the substrate 110 to form the contact portion CNT at or via a contact hole CH4 extending through each of the buffer layer 10 and the first insulating layer 11 through the third insulating layer 13. In other words, the connection electrode 301 corresponds to the conductive layer 30 shown in FIGS. 1 through 3. The initialization line VL is placed on the second insulating layer 12 and the connection electrode 301 is placed on the third insulating layer 13, so as to be in different layers from each other.

The contact hole CH4 exposes a portion of the first electrode E41 of the fourth transistor T4 and a portion of the substrate 110. The connection electrode 301 may, at or via the contact hole CH4, contact a portion of the first electrode E41 of the fourth transistor T4 and the substrate 110. The connection electrode 301 may contact the third layer 115 (see FIG. 1 or 2) or the fifth layer 114 (see FIG. 3) of the substrate 110. Referring to FIG. 5, the portion of the first electrode E41 of the fourth transistor T4, which contacts the connection electrode 301, may be a portion of the second electrode E72 of the seventh transistor T7. In other words, the contact portion CNT may be near or disposed corresponding to two transistor, e.g., the fourth transistor T4 and the seventh transistor T7.

The connection electrode 301 may provide a constant initialization voltage Vint to the substrate, thereby maintaining the voltage in the third layer 115 of the substrate 110 uniform.

Figure 10:
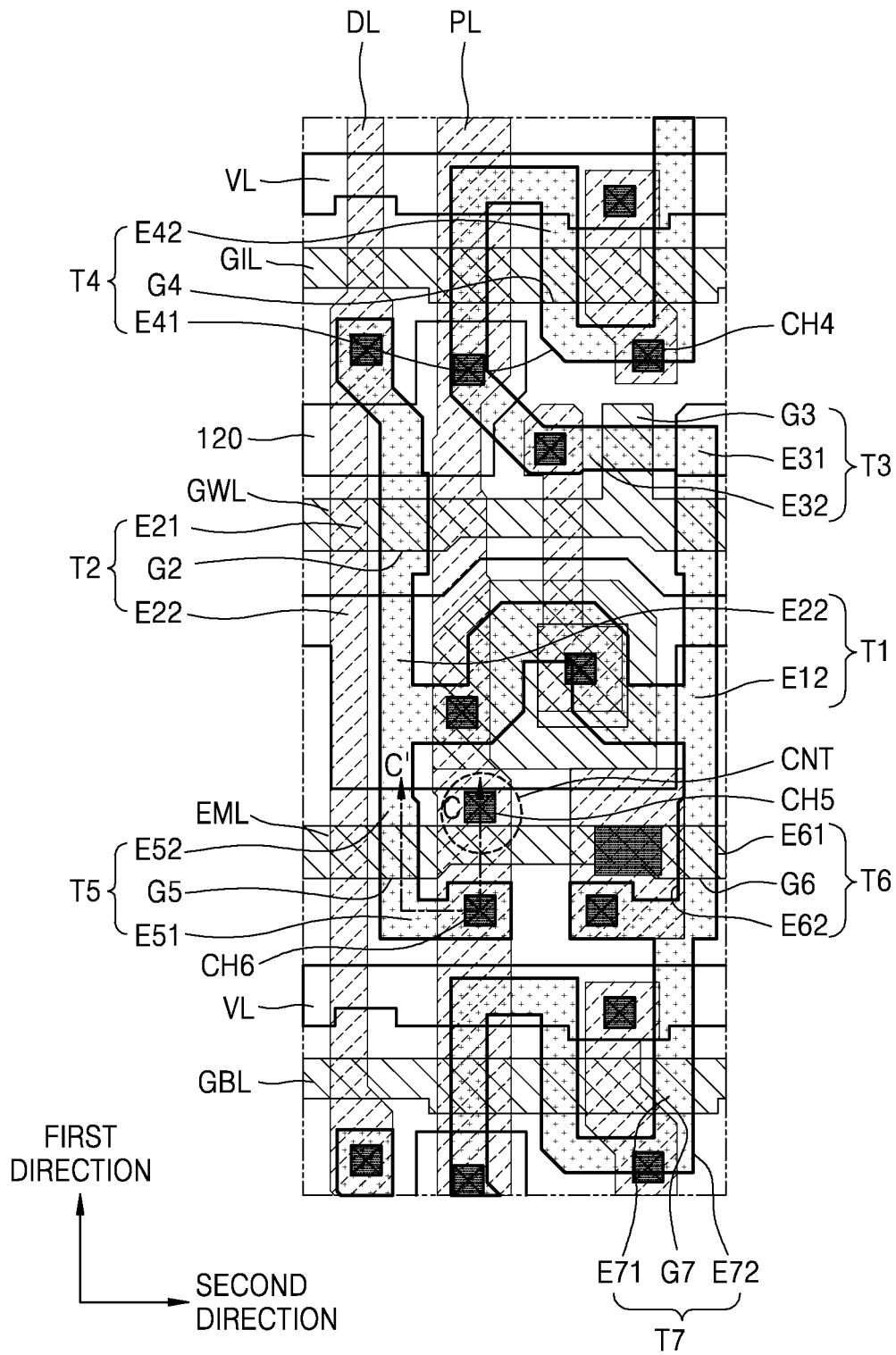
FIG. 10 is a top-plan view of still another embodiment of a pixel circuit of the pixel shown in FIG. 5, according to the invention.
Figure 11:
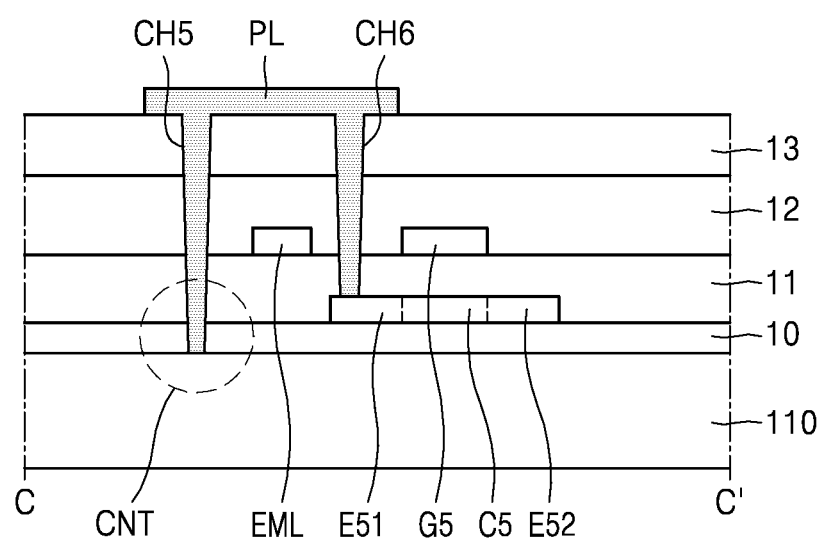
FIG. 11 is a cross-sectional view taken along line C-C' shown in FIG. 10.

FIG. 10 is a top-plan view of still another embodiment of a pixel circuit of the pixel shown in FIG. 5, according to the invention. FIG. 11 is a cross-sectional view taken along line C-C' shown in FIG. 10.

The embodiment shown in FIG. 10 is different from the embodiment shown in FIG. 6 in that the power line PL corresponds to the conductive layer 30 shown in FIGS. 1 through 3. Hereinafter, configurations different from those of FIGS. 6 and 7 will be mainly described.

Referring to FIGS. 10 and 11, the power line PL is electrically connected to the first electrode E51 of the fifth transistor T5 at or through a contact hole CH6 in the first insulating layer 11 through the third insulating layer 13, and further contacts the substrate 110, at the contact portion CNT, at or via a contact hole CH5 extending through the buffer layer 10 and the first insulating layer 11 through the third insulating layer 13. In other words, the power line PL corresponds to the conductive layer 30 shown in FIGS. 1 through 3. The power line PL may contact the third layer 115 (see FIG. 1 or 2) or the fifth layer 114 (see FIG. 3) of the substrate 110. The power line PL is placed on the third insulating layer 13.

The contact hole CH5 exposes a portion of the substrate 110, and the contact hole CH6 exposes a portion of the first electrode E51 of the fifth transistor T5. The power line PL may provide a constant first power supply voltage ELVDD to the substrate 110, thereby uniformly maintaining the voltage in the third layer 115 of the substrate 110.

The contact portion CNT according to one or more of the embodiments may be provided in each of the plurality of pixels in the first direction, in the second direction or the first and second direction. The contact portion CNT according to one or more of the embodiments may be provided only in pixels disposed at intervals along the first and/or second direction.

According to the embodiments, at least one of the contact portion CNT shown in FIG. 6, the contact portion CNT shown in FIG. 8, and the contact portion CNT shown in FIG. 10 may be provided in each of the pixels in the first direction, in the second direction, or the first and second direction. According to the embodiments, at least one of the contact portion CNT may be provided only in the pixels disposed at intervals along the first and/or second directions.

The contact portion CNT according to embodiments of the present disclosure is not limited to a position disclosed in the above-described embodiments and be adopted in every case in which a conductive wire for applying a constant direct current voltage is provided at a position to contact a substrate in pixel units (e.g., each pixel or pixels at an interval) according to a pixel design.

A display device according to one or more of the embodiments may, in a pixel, include a contact portion in which a conductive layer element through which a constant voltage is transmitted and a substrate contact each other, thereby providing a constant voltage to the substrate. Accordingly, a voltage may uniformly maintained in the organic layer of the substrate despite a voltage change due to operations of transistors near the driving transistors. Thus, the back channel potential of the driving transistor may be stably maintained.

A display device according to one or more of an embodiment may be employed in portable electronic display terminals such as a tablet personal computer ("PC"), a smart phone, a personal digital assistant ("FDA"), a portable multimedia player ("PMP"), a game player, and a watch-type electronic device. A display device is not limited to the portable electronic display terminals and may also be used in relatively large-sized electronic devices such as a television or an outside signboard, or relatively small or medium-sized electronic devices such as a personal computer ("PC"), a notebook computer, a vehicle navigation unit, or a camera. The embodiments are not limited to the above-described embodiments and may also be employed in other electronic devices within the concept of the present disclosure.

The display device may provide relatively high-quality images by reducing or effectively preventing an after-image phenomenon.

It will be understood that embodiments described herein are considered in a descriptive sense only and not for purposes of limitation. Descriptions of features within each embodiment will be considered as available for other similar features in other embodiments.

While one or more embodiments have been described with reference to the drawings, it will be understood by those of ordinary skill in the art that various changes in forms and details may be made therein without departing from the spirit and scope as defined by the following claims.

What is claimed is:

1. A display device comprising:
an insulating substrate comprising an organic material;
a semiconductor layer of a transistor, on the insulating substrate;
a gate electrode of the transistor, on the semiconductor layer; and
a conductive layer element corresponding to the transistor, the conductive layer element both electrically connected to a constant voltage source and contacting the insulating substrate.

2. The display device of claim 1, further comprising a power line through which a power voltage is transmitted, the power line in a different layer from that of the conductive layer element and electrically connected to the conductive layer element.

3. The display device of claim 1, wherein the insulating substrate comprises:
an organic layer; and
an inorganic layer on the organic layer.

4. The display device of claim 3, wherein the conductive layer element contacts the insulating substrate at the organic layer.

5. The display device of claim 1, wherein the insulating substrate comprises in order in a direction towards the transistor:
a first organic layer;
a first inorganic layer on the first organic layer;
a second organic layer on the first inorganic layer; and
a second inorganic layer on the second organic layer.

6. The display device of claim 5,
wherein the insulating substrate further comprises an inorganic conductive layer between the first inorganic layer and the second organic layer.

7. The display device of claim 6, wherein the conductive layer element contacts the insulating substrate at the inorganic conductive layer between the first inorganic layer and the second organic layer.

8. The display device of claim 6, wherein within the insulating substrate, the inorganic conductive layer between the first inorganic layer and the second organic layer comprises conductive hydride amorphous silicon or a conductive oxide.

9. The display device of claim 1, further comprising:
an insulating layer between the insulating substrate and the conductive layer element, and
a first contact hole in the insulating layer which exposes the semiconductor layer and a second contact hole in the insulating layer which exposes the insulating substrate,
wherein the conductive layer element contacts the semiconductor layer of the transistor at the first contact hole and contacts the insulating substrate at the second contact hole.

10. The display device of claim 1, further comprising:
an insulating layer between the insulating substrate and the conductive layer element, and
a same contact hole in the insulating layer which exposes both the semiconductor layer of the transistor and the insulating substrate,
wherein at the same contact hole, the conductive layer element contacts the semiconductor layer of the transistor and the insulating substrate.

11. The display device of claim 1, further comprising:
a buffer layer between the insulating substrate and the semiconductor layer and comprising an inorganic layer.

12. The display device of claim 11, wherein the insulating substrate comprises an organic layer and an inorganic layer, and the conductive layer element contacts the organic layer.

13. A display device comprising:
an insulating substrate comprising an organic material;
a pixel on the insulating substrate; and
a conductive layer element through which a constant voltage is applied to the pixel,
wherein at the pixel, the conductive layer element contacts the insulating substrate.

14. The display device of claim 13, further comprising the pixel provided in plurality arranged on the insulating substrate,
wherein
the conductive layer element in contact with the insulating substrate, forms a contact portion, and the contact portion is formed in each of the plurality of pixels.

15. The display device of claim 13, further comprising the pixel provided in plurality arranged on the insulating substrate,
wherein
the conductive layer element in contact with the insulating substrate, forms a contact portion, and
the contact portion is formed in less than each of the plurality of pixels.

16. The display device of claim 13, further comprising the pixel provided in plurality arranged along a first direction on the insulating substrate,
wherein the conductive layer element extends along the first direction on the insulating substrate and overlaps a driving transistor in each pixel among the plurality of pixels arranged along the first direction.

17. The display device of claim 16, further comprising a power line through which a power voltage is transmitted to the pixel, the power line extending in a second direction crossing the first direction, disposed in a layer different from that of the conductive layer element and electrically connected to the conductive layer element.

18. The display device of claim 13, wherein the conductive layer element comprises:
a first power line extending in a first direction and through which a first direct current voltage is applied to the pixel, and
a second power line extending in a second direction crossing the first direction and through which a second direct current voltage is applied to a same pixel to which the first direct current voltage is applied.

19. The display device of claim 13, further comprising a transistor in the pixel, the transistor comprising a semiconductor layer,
wherein a same one of the conductive layer element which contacts the insulating substrate at the pixel, further contacts the semiconductor layer of the transistor at the pixel.

20. The display device of claim 13, wherein
the insulating substrate comprises:
an organic layer; and
an inorganic layer, and
at the pixel, the conductive layer element contacts the insulating substrate at the organic layer.

21. The display device of claim 20, wherein the insulating substrate further comprises in order in a direction towards the conductive layer element:
a first organic layer;
a first inorganic layer on the first organic layer;
a second organic layer on the first inorganic layer;
a second inorganic layer on the second organic layer; and
an inorganic conductive layer between the first inorganic layer and the second organic layer.

22. The display device of claim 21, wherein at the pixel, the conductive layer element contacts the insulating substrate at the inorganic conductive layer between the first inorganic layer and the second organic layer.

* * * * *